(12) United States Patent
Homberg et al.

(10) Patent No.: US 6,941,503 B1
(45) Date of Patent: Sep. 6, 2005

(54) METHOD AND APPARATUS FOR RETAINING ERROR-CONTROL CODE PROTECTION ACROSS BLOCK-SIZE DISCONTINUITIES

(75) Inventors: Michael J. Homberg, Westborough, MA (US); Joris Wils, Acton, MA (US); Jack J. Stiffler, Marion, MA (US); Raju C. Bopardikar, Carlisle, MA (US)

(73) Assignee: EMC Corporation, Hopkinton, MA (US)

( * ) Notice: Subject to any disclaimer, the term of this patent is extended or adjusted under 35 U.S.C. 154(b) by 447 days.

(21) Appl. No.: 10/016,440

(22) Filed: Dec. 11, 2001

(51) Int. Cl.[7] ............................................ H03M 13/00
(52) U.S. Cl. ...................... 714/755; 714/774; 714/776
(58) Field of Search ............................... 714/755, 774, 714/776; 370/389

(56) References Cited

U.S. PATENT DOCUMENTS

| | | | | |
|---|---|---|---|---|
| 6,157,642 A | * | 12/2000 | Sturza et al. | 370/389 |
| 6,263,466 B1 | * | 7/2001 | Hinedi et al. | 714/755 |
| 6,442,176 B1 | * | 8/2002 | Yahagi | 370/474 |

OTHER PUBLICATIONS

Stephen B. Wicker, "Error Control Systems for Digital Communication and Storage", Prentice-Hall, 1995, pp. 116-119.*

* cited by examiner

Primary Examiner—Joseph D. Torres
(74) Attorney, Agent, or Firm—Kudirka & Jobse, LLP

(57) ABSTRACT

Each time data, in the form of data blocks protected by code checks, must be reformatted, the original data is broken into new data blocks and a new code check is calculated from, and combined with, each new data block, but the new data blocks and new code checks are both reconstituted versions of the original data blocks and the original code checks. Consequently, the data is never left without protection. In one embodiment, an ingress encoder recomputes an ingress code check from an original data block and its associated header. An egress encoder computes an egress code check from the egress header for an outgoing data block reformatted from the original data block and the ingress code check. The outgoing information is then assembled from the egress header, the outgoing data block and the newly computed egress code check.

41 Claims, 10 Drawing Sheets

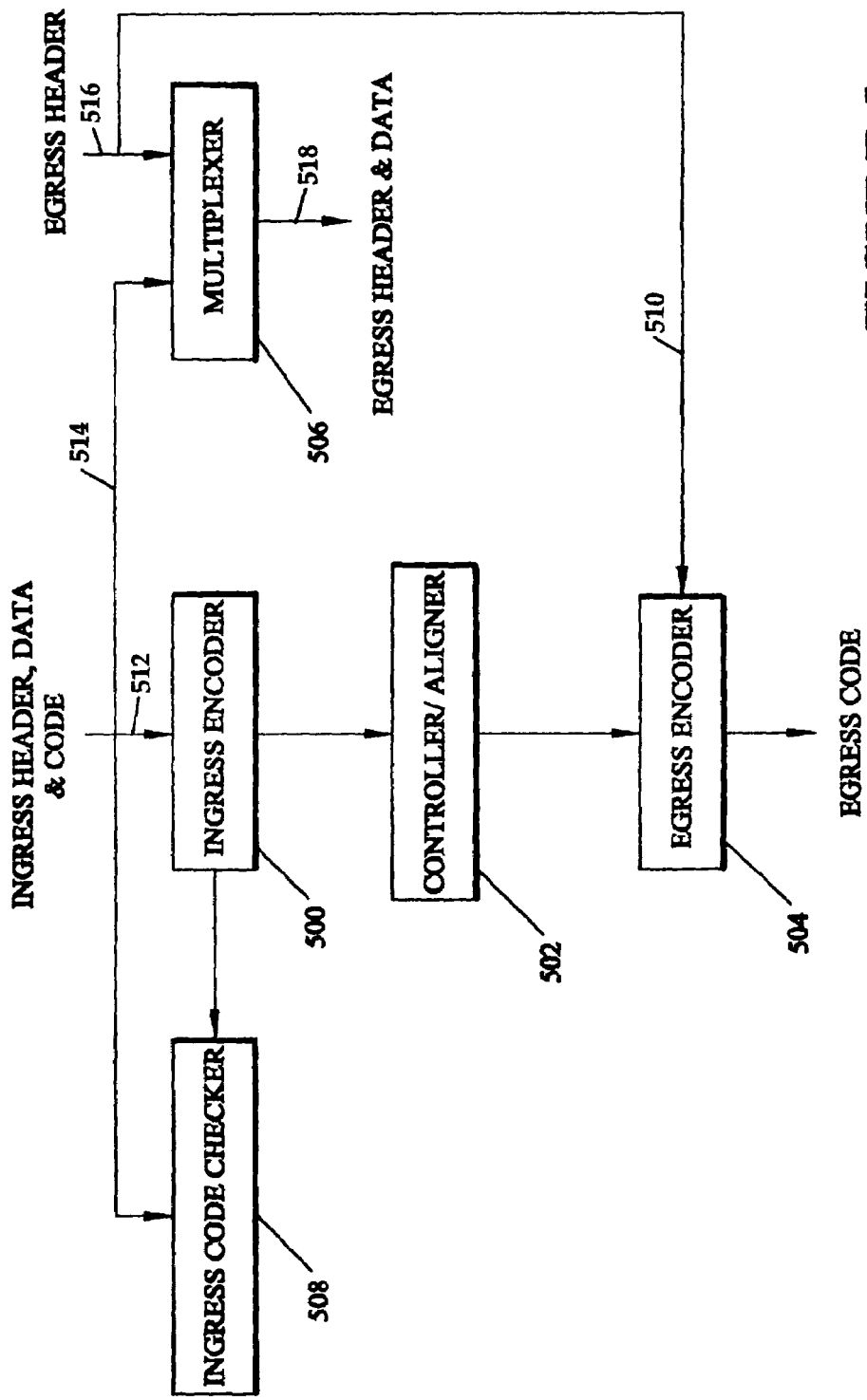

METHOD AND APPARATUS FOR RETAINING ERROR-CONTROL CODE PROTECTION ACROSS BLOCK-SIZE DISCONTINUITIES

FIELD OF THE INVENTION

This invention relates to error detection and correction in data that is being transferred from one location to another.

BACKGROUND OF THE INVENTION

In applications involving the transfer of data from one location to another, it is frequently necessary to make changes to the data format along the way. The data headers and the size of the packets or blocks into which the data is assembled, in particular, may be dictated by such things as memory organization and address boundaries on the one hand and by the applicable communication protocol on the other. The result is that the "natural" block size at the data source and that at the data destination may be incompatible. Consequently, the error-control coding technique used to monitor the integrity of the data at its source cannot be used to protect it all the way to its destination.

The prior-art technique for addressing this problem is to check the integrity of the data at each point at which the format has to be changed and then to re-encode the data using a coding technique that is compatible with the new format. This technique leaves the data unprotected during this transition; that is, there is generally no way of ensuring that the data has not changed between the integrity check and the calculation of the new code check.

An even more serious problem resulting from the need to check the validity of an error-control code each time the data format changes is the concomitant increase in the complexity of the software that is typically involved in shepherding the data from its source to its destination. If the error-control code has to be checked each time the format changes, and, if that check indicates a problem, remedial action has to be taken. This requirement greatly complicates the software, increasing significantly the time needed to develop and test it, reducing its reliability and increasing its run time.

If, in contrast, the error-control code needs to be checked only at the destination, the intermediate code checks and diagnostic and recovery software can be eliminated from the main thread of execution. If a code fault is detected at the destination, the associated data block or packet is simply rejected and a separate software routine, external to the main execution thread, is used to diagnose the problem. Since data errors are generally rare and, in the vast majority of cases, are due to transient or intermittent events that are especially difficult to deal with in software, the benefit in avoiding the added performance and reliability costs of having multiple checks for such events is significant.

The conventional solution to the problem of monitoring the integrity of data across format discontinuities is shown in FIG. 1A. Data emerges from the data source 100 and is protected by an error-detecting, or an error-correcting, code. Typically, the codes used are systematic codes; that is, the data is transferred without modification followed by a code check calculated from that data and designed to expose any errors suffered by the data during the transfer. When the data with its appended code check is received at a destination, a verifier 102 regenerates the code check from the data and compares the regenerated code check to the code check received along with the data. If the two code checks are identical, the data is accepted as is. If not, the data is either rejected or corrected, depending on the type of code being used. To protect the data as it is being passed on to its destination (e.g., to a storage medium), the data is then repartitioned into blocks with an appropriate block size by a reformatter 104 and a new code check is calculated for each block by a code check generator 106 and appended to the new data block.

FIG. 1B is a flowchart of the steps needed to implement a representative example of such a procedure. Here, data is received and its integrity checked in step 108. A decision is made in step 110 whether the data passes the integrity check. If the integrity check fails in step 110, a diagnostic and recovery routine is initiated in step 126 in an attempt to identify the problem and take remedial action (e.g., inform the data source that the data was corrupted in transmission).

Alternatively, if the data passes the integrity check as determined in step 110, the data is then reformatted and re-encoded in step 112 for transmission to a data cache where its integrity is again checked in step 114. If, as determined in step 116, the integrity check fails, another diagnostic and recovery routine is initiated in step 128 which is necessarily different from the previous diagnostic routine initiated in step 126 and which results in different remedial action.

Alternatively, if the data passes this second test as determined in step 116, the data is then reformatted and re-encoded a second time in step 118 and passed on to its next destination, in this case a storage unit, where its integrity is checked once again in step 120. A Failure as determined in step 122 forces a third diagnostic and recovery routine to be called in step 130. This third diagnostic routine is specific to the new data format and code and results in yet another remedial response.

Alternatively, if as determined in step 122, as will be true in the vast majority of cases, all the data is found to be valid at each integrity check, it is finally stored in step 124. Still, because of the rare event that a data error could be experienced during any of these transfers, separate diagnostic routines initiated in steps 126, 128 and 130, each adding complexity and introducing potential bugs to the main thread of execution, are required at each step.

Therefore, there is a need for an apparatus and method that can protect data as the data is being reformatted without introducing a large amount of complexity.

SUMMARY OF THE INVENTION

In accordance with the principles of the present invention, at each format discontinuity, the original data is broken into new data blocks and a code check is calculated from, and combined with, each new data block, but the new data blocks and new code checks are both reconstituted versions of the original data blocks and the original code checks. Consequently, the data is never left without protection.

In one embodiment, an ingress encoder recomputes an ingress code check from an original data block and its associated header using the same algorithm that was used to originally compute the code check. An egress encoder computes an egress code check using the same code check algorithm from the egress header for an outgoing data block reformatted from the original data block and the data portion of ingress code check. The outgoing information is then assembled from the egress header, the outgoing data block and the newly computed egress code check.

In another embodiment, a controller/aligner subtracts the portion of the ingress code check that was generated from the ingress header from the contents of the egress encoder during the computation of the egress code check in order to remove the effects of the ingress header. The controller/aligner then adds the ingress code check to the contents of the egress decoder during computation of the egress code check.

In yet another embodiment, the controller/aligner adjusts the ingress code check before it is added to the contents of the egress decoder to account for non-data bits or bytes added to the incoming data to align the data to word boundaries.

In still another embodiment, the controller/aligner rotates the ingress code check before it is added to the contents of the egress decoder to account for non-data bits or bytes added to the incoming data to align the data to word boundaries.

In yet another embodiment, the ingress header and data are modified before the ingress code check is computed to account for non-data bits or bytes added to the incoming data to align the data to word boundaries.

In another embodiment, the ingress and egress encoders are arithmetic encoders that generate a one's-complement sum of the ingress and egress data to be encoded.

In still another embodiment, the ingress and egress encoders are encoders that generate a vertical-parity check code from the ingress and egress data to be encoded.

In another embodiment, the ingress and egress encoders are cyclic-residue code encoders that generate a cyclic residue code from the ingress and egress data to be encoded.

BRIEF DESCRIPTION OF THE DRAWINGS

The above and further advantages of the invention may be better understood by referring to the following description in conjunction with the accompanying drawings in which:

FIG. 5 is a block schematic diagram of an encoding apparatus constructed in accordance with the principles of the invention.

DETAILED DESCRIPTION

Figure 1A:
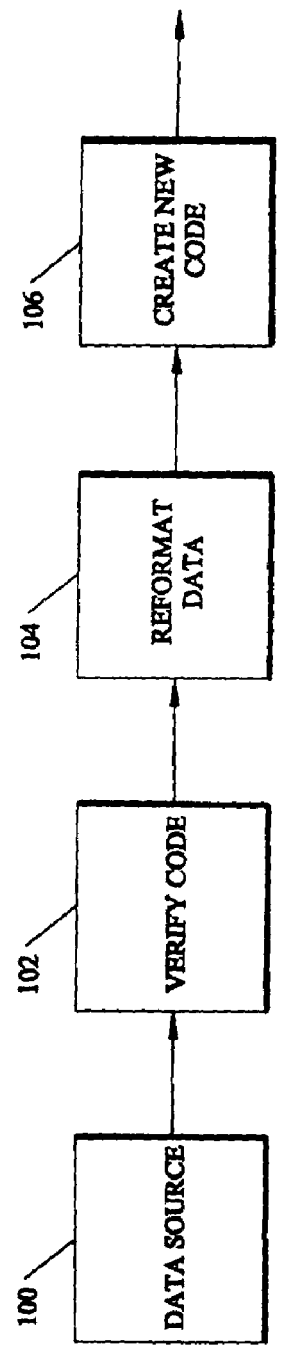
FIG. 1A is a block schematic diagram illustrating a prior art apparatus for protecting data with code checks.
Figure 2A:
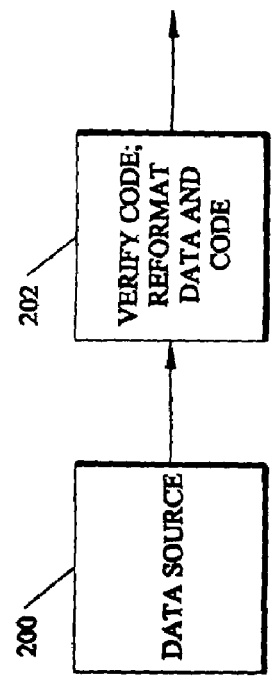
FIG. 2A is a block schematic diagram illustrating an apparatus for protecting data with code checks constructed in accordance with the principles of the invention.
Figure 1B:
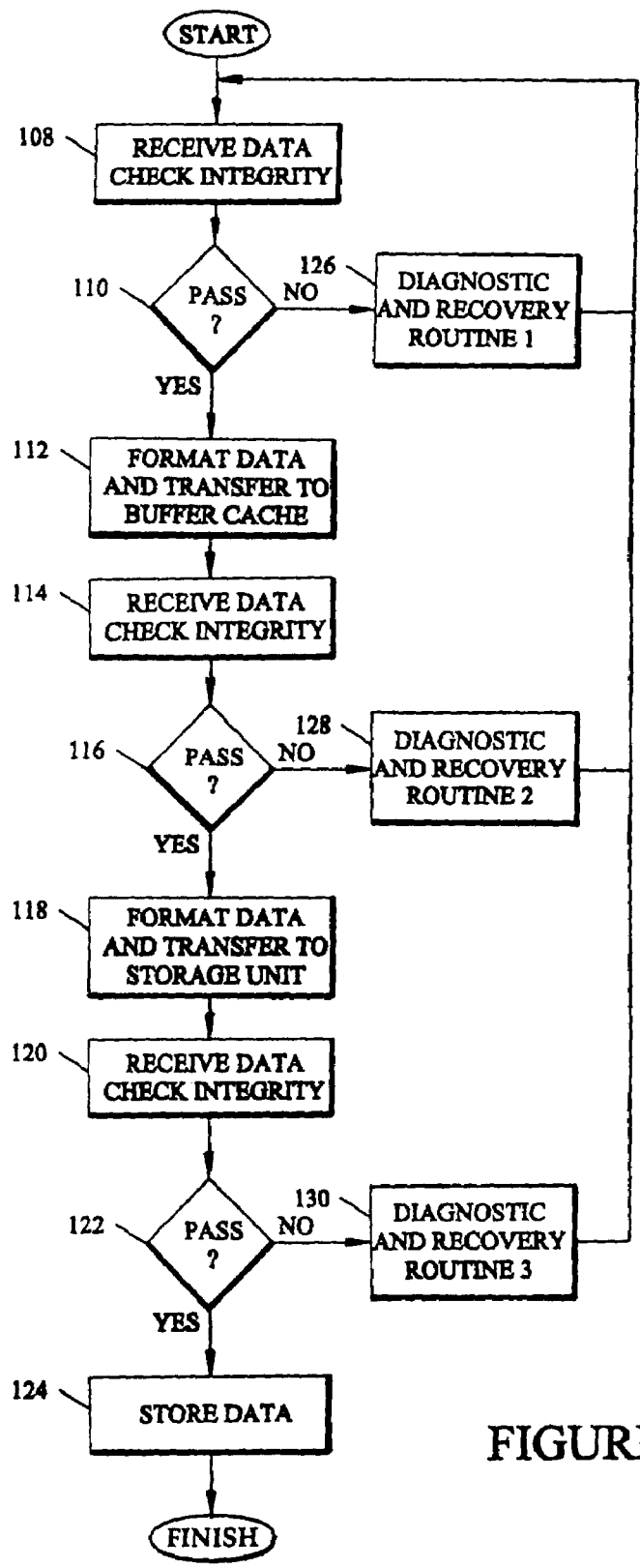
FIG. 1B is a flowchart illustrating the steps needed to implement the prior art method of protecting data with code checks.

In accordance with the principles of the present invention, as illustrated in FIG. 2A, code checks are calculated from data generated by data source 200 and appended to the data as in the prior art, but the new data blocks and new code checks are both reconstituted versions of the old data and code checks as calculated by the verifier/formatter 202. The data is never left without protection.

Figure 2B:
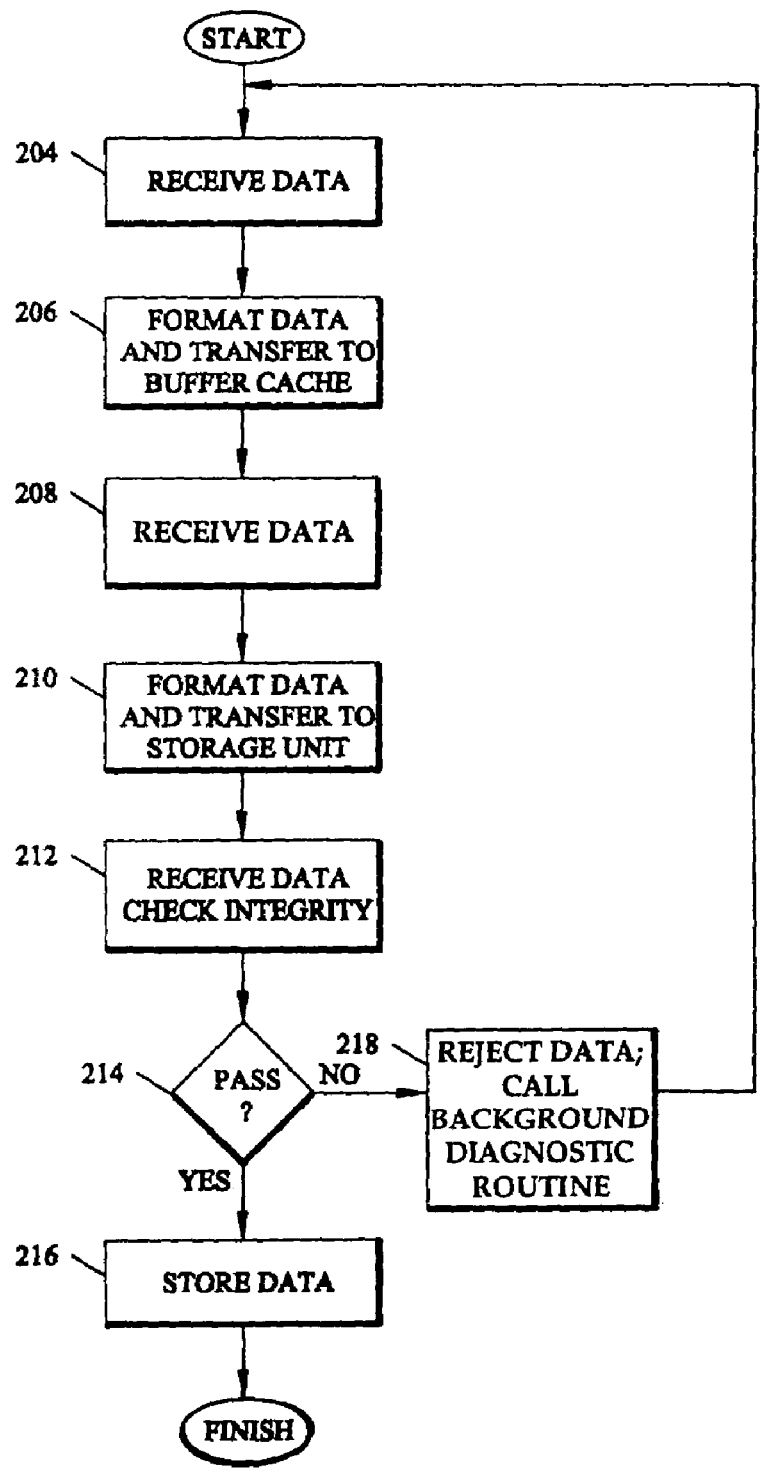
FIG. 2B is a flowchart illustrating the steps needed to implement the inventive method of protecting data with code checks.

A flow chart depicting the data processing at the data format discontinuities set forth in the previous example is now greatly simplified as shown in FIG. 2B. The data is now simply received in step 204, reformatted, and transferred to the buffer cache in step 206. Code checks are recalculated in step 206 using the same coding algorithm that was originally used to calculate code checks for the data received in step 204. The data and recalculated code checks are sent on to the next stage where they are received in step 208 and reformatted in step 210. Again, the code checks are recalculated using the same algorithm as used in step 206.

Data integrity is checked only at its final destination in step 212. A determination is made in step 214 whether the integrity check has been passed. If found to be valid, then the data is stored in step 216. Otherwise, the process proceeds to step 218 where the data packets from which the storage block is composed are rejected and a message to that effect is sent to the source. Only one diagnostic routine is needed; it is called from the main program thread but run in a background mode in an attempt to determine the source of the problem.

Since the data has been rejected at this point, no attempt need be made to try to recover it. Should the problem be the result of a transient event of some kind, as it is in the large majority of cases, operation will continue normally, without interruption. If, instead, the problem is due to a permanent hardware malfunction, subsequent data packets will also be found to be invalid. In this case, since permanent faults are generally easy to isolate, the background diagnostic routine should quickly identify the problem.

Figure 3A:
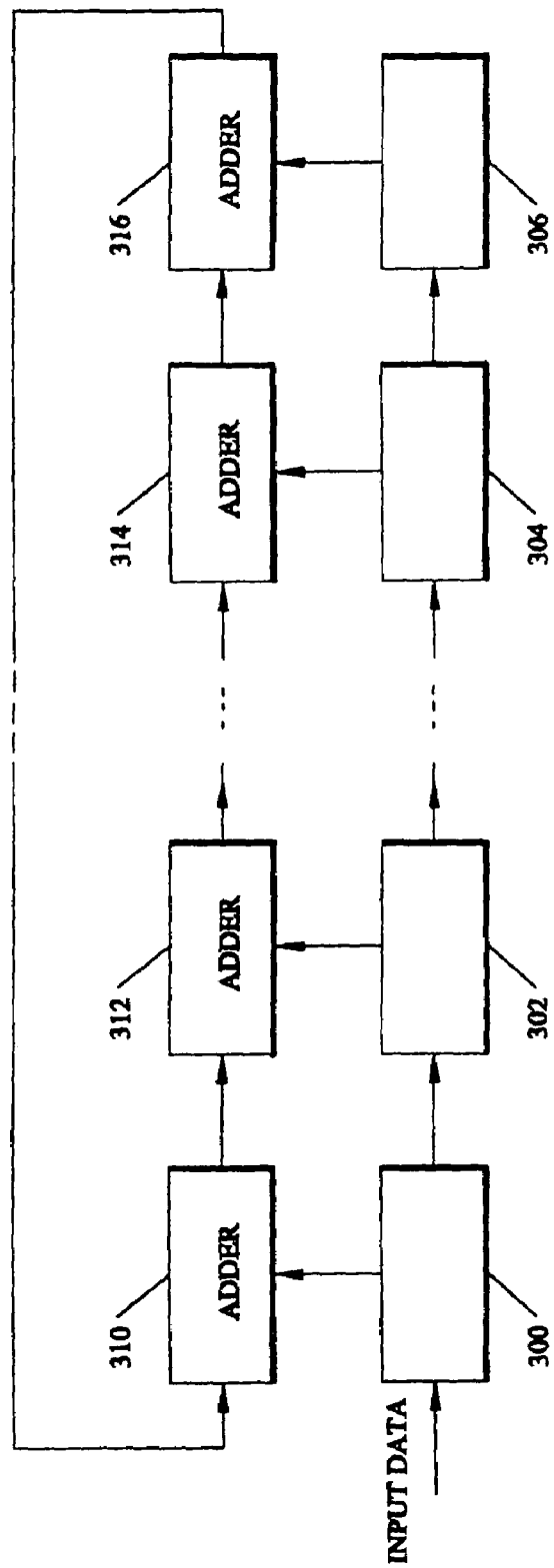
FIG. 3A is a block schematic diagram of a conventional arithmetic code check encoder for encoding a serial data stream.

The present invention can be used in conjunction with any of a large class of error-control codes involving sequential operations on successive data elements. Typical codes used for this purpose include arithmetic codes, vertical-parity codes and cyclic-residue codes (CRCs). An arithmetic code of the type used for Transmission Control Protocol (TCP) and User Datagram Protocol (UDP) communication is illustrated in FIG. 3A. In order to generate the code from binary input data, the data is shifted into an n-bit shift-register comprised of stages 300–306. When each group of n bits, called a "word", have been shifted in, the contents of the register are added to the, initially all zero, contents of an adder, also comprised of adder elements 310–316. Each adder element calculates the binary sum of the data input, its current contents and the carry input from its neighbor, as indicated by the arrows, to produce its new contents (which it retains) and carry bit. The adder thus contains the one's-complement sum of all the words shifted into the shift-register since the adder was last reset. This sum, or, in the case of TCP and UDP, the one's complement of this sum, is then used as the code check.

Figure 3B:
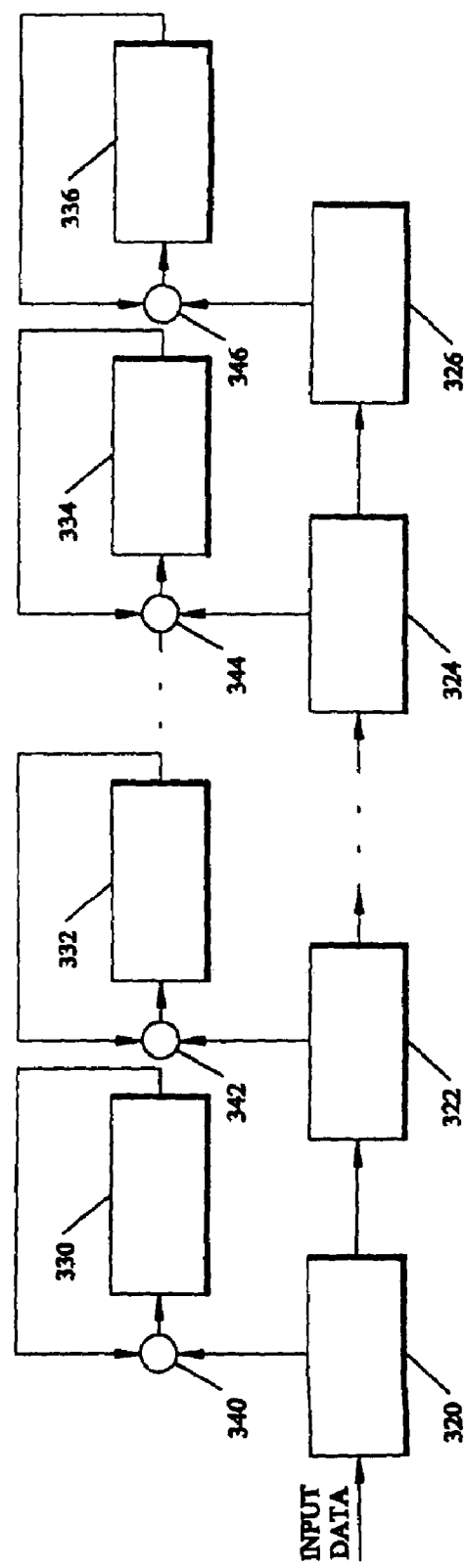
FIG. 3B is a block schematic diagram of a conventional vertical-parity-check code check encoder for encoding a serial data stream.

A vertical parity check encoder is shown in FIG. 3B. It differs from the previous coding technique only in the way in which the successive words are operated on to form the code check. In this case, the contents of a register comprising stages 330–336 are combined, using exclusive-OR gates 340–346, with the corresponding bits of each new data word after the new data word has been shifted into the input shift-register stages 320–326. Thus, at any instance, the kth register stage (of stages 330–336 contains the exclusive-OR of the kth bit of every word that has been presented to it since it was last reset. The contents of the register stages 330–336 after all data words in the block have been received constitute the code check.

Figure 3C:
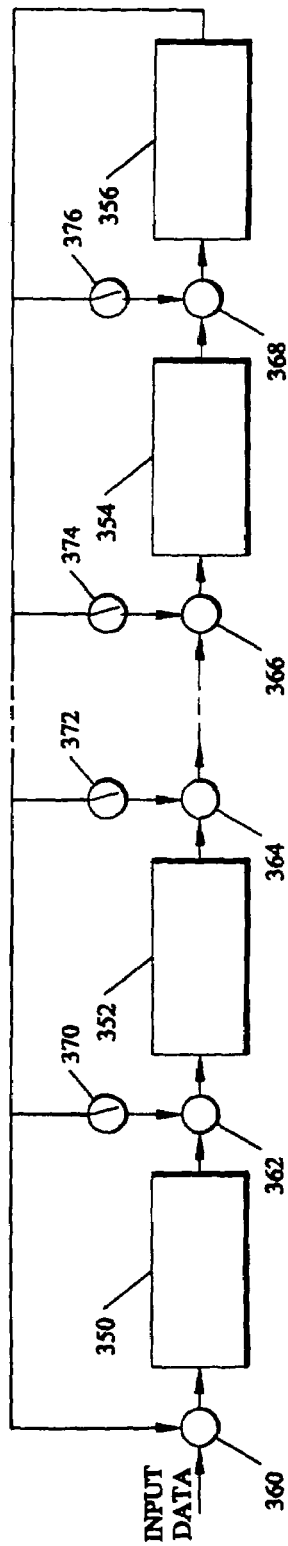
FIG. 3C is a block schematic diagram of a conventional cyclic-residue-code check encoder for encoding a serial data stream

Cyclic-residue codes are also used to protect data transferred over certain communication links, for example Ethernet and Fibre Channel links. An example of a CRC generator is shown in FIG. 3C. Here, the shift-register itself, comprised of stages 350–356, constitutes the generator. As new data bits are shifted in, the register contents are modified by forming the exclusive-OR, using a subset of the exclusive-OR gates 360–368, of the bits that may be shifted into some of its stages with the bit in its last stage (356). The bits that are shifted into the stages are determined by which of the connections, symbolically illustrated by the switches 370–376 are actually implemented. After all the data that is to be encoded is presented to the shift-register, which is initially set to a known value (usually all zeros) its contents define the code check.

For purposes of the subsequent discussion, it is useful to recognize that if the data is interpreted as a binary polynomial $d(x)$ of degree N-1, with N the number of bits to be encoded, and the feedback connections are used to define the coefficients of a binary polynomial $g(x)$ of degree n, then the CRC code check is just the value of $d(x)$ modulo $g(x)$. That is, if $d(x)=d_0 x^{N-1}+d_1 x^{N-2}+ \ldots +d_{N-2}x+d_{N-1}$, with $d_k$ the kth data bit and if $g(x)=x^n+g_{n-1}x^{n-1}+g_{n-2}x^{n-2}+ \ldots +g_1 x+1$, with $g_j=1$ if and only if the feedback connection to the ith stage ($0 \leq i \leq n-1$) of the shift-register shown in FIG. 3C is in fact made, then the code check is equal to $d(x)$ modulo $g(x)$.

Figure 4A:
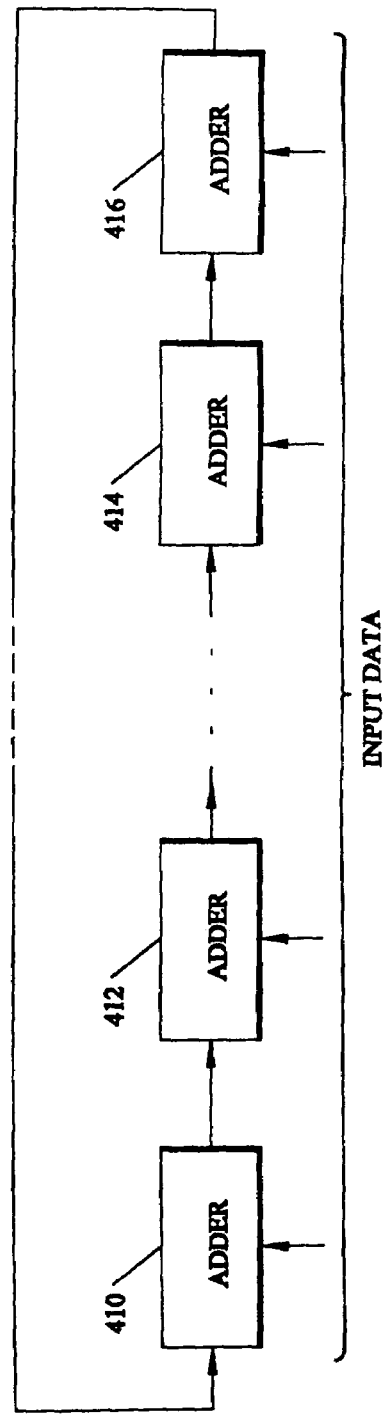
FIG. 4A is a block schematic diagram of a conventional arithmetic code check encoder for encoding a parallel data stream.
Figure 4B:
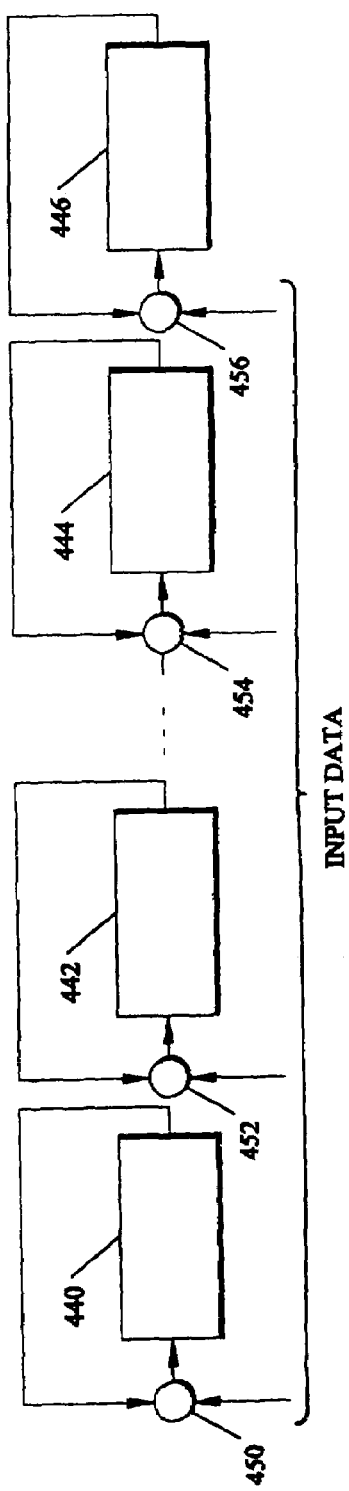
FIG. 4B is a block schematic diagram of a conventional vertical-parity-check code check encoder for encoding a parallel data stream.
Figure 4C:
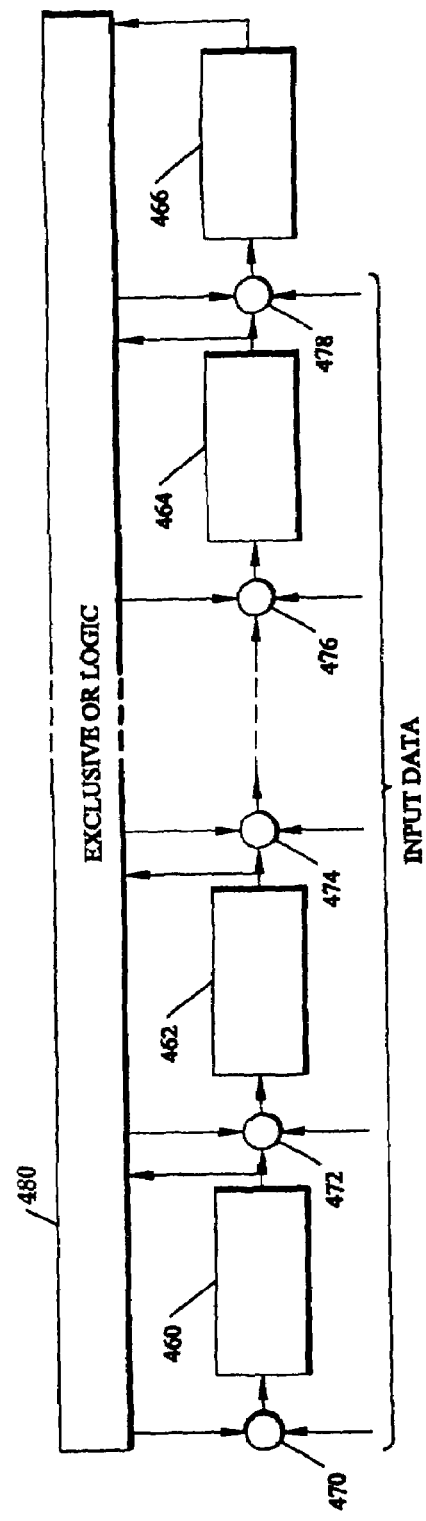
FIG. 4C is a block schematic diagram of a conventional cyclic-residue-code check encoder for encoding a parallel data stream

The encoders in FIGS. 3A–3C are designed to accept data serially. This is generally the case when the data is received over a communication link. Sometimes, for example, when data is being read out of a random-access memory, it is more natural to present it to the encoder in parallel, one word at a time. The encoders of FIGS. 3A–3C are shown in FIGS. 4A–4C modified to accept parallel inputs. Both the one's-complement and the vertical-parity-check encoders are actually simplified with this FA change since the serial-to-parallel converting shift-registers needed for the serial implementation can be eliminated here.

In the one's-complement encoder shown in FIG. 4A, each bit of an n-bit word is entered into an adder comprised of adder elements 410–416. Each adder element calculates the binary sum of the data input, its current contents and the carry input from its neighbor, as indicated by the arrows, to produce its new contents (which it retains) and carry bit. The adder thus contains the one's-complement sum of the word entered into the adder elements. This sum, or, in the case of TCP and UDP, the one's complement of this sum, is then used as the code check.

The vertical parity check encoder is shown in FIG. 4B. The input bits are applied as one input to exclusive-OR gates 450–456. The other inputs to the exclusive-OR gates 450–456 are the contents of the associated register stages 440–446. The output of each exclusive-OR gate is stored in its corresponding register stage. Thus, at any instance, the kth register stage contains the exclusive-OR of the kth bit of every word that has been presented to it since it was last reset. The contents of the register stages 440–446 after all data words in the block have been received constitute the code check.

The parallel CRC encoder uses register stages 460–466 that are connected together by exclusive-or gates 470–478 as shown in FIG. 4C. The parallel CRC encoder becomes somewhat more complicated, however, with the simple exclusive-or gates (360–368) in the serial case replaced by a more complex exclusive-or logic tree 480 as indicated in FIG. 4C. Logic tree 480 generates the same function of its contents that would be obtained by shifting the register in FIG. 3C n times, with n the length of the register. For example, let n=4 and let the contents of the last stage be fed back into the first and second stages (so that $g(x)=x^4+x+1$). Then, as is easily verified, the contents of the first through the fourth stages of the shift-register after four shifts are $x_0+x_3$, $x_0+x_2+x_3$, $x_1+x_2$, $x_0+x_1$, respectively, with $x_0$, $x_1$, $x_2$ and $x_3$ the initial contents of those stages, and the exclusive-OR logic is defined accordingly. (The symbol "+" here indicates addition over the binary field, i.e., the exclusive-OR operation.)

An important feature of the coding techniques described in the previous paragraphs is that they are all "linear" in the sense that the sum of valid code checks on any two blocks of data is itself a valid code check on the sum of the data blocks. The meaning of "sum" here depends on the way in which the code check is defined. For the previously described arithmetic code, sum means the one's complement sum. For the vertical-parity-check and CRC codes, sum means the module-two sum (exclusive-OR) of corresponding bits. The CRC code differs from the other two, however, in the way in which two blocks have to be aligned for the linearity property to hold. With the one's-complement and vertical parity codes, only word alignment is required. That is, the sum of the code checks on two data blocks is a valid code check on the sum of the two blocks regardless of how the words comprising those blocks are ordered or of which words are summed with which other words. The same statement is true for CRC codes only if the codes are block aligned and the corresponding bits are summed. The term "block" in this context means the shorter of (1) the block of data that is being encoded and (2) the length of the sequence generated by the CRC generator polynomial. Since the former is generally considerably shorter than the latter, block-alignment will usually mean alignment of the two data blocks themselves.

In the following discussion, the terms "code check" and "code" will be used interchangeably when there is no danger of ambiguity. The "inverse" y of an entity x will mean its additive inverse, i.e., the quantity such that x+y=0 with "+" indicating "sum" as previously defined. Specifically, if sum is the one's complement sum, the inverse of x is its one's complement and if sum is the modulo-two sum, the inverse is just x itself.

In addition, when zero-stuffing is used to align two data streams, the term "alignment" in this context will mean alignment, modulo the word length, when the code check is defined by either the one's complement or the vertical-parity-check codes and alignment, modulo the block length, when the code check is defined by a CRC.

The terms "word oriented" and "block oriented" will be used to distinguish codes whose linearity properties depend, respectively, on word and block alignment.

The encoding procedure of the present invention is illustrated in FIG. 5. The modifier "ingress" is used there to denote the information (header and data) as received from the source and "egress" is used for the information that is to be sent to the destination after an appropriate format modification. The two encoders shown in FIG. 5 (500 and 504) can be either serial or parallel versions of any one of the three types of encoders shown in FIGS. 3A–3C and 4A–4C. Generally, serial encoders are used when the ingress data is serial in nature (e.g., when received over a communication link) and parallel encoders are used when it is inherently parallel (e.g., when it is retrieved from random access memory or received over a parallel bus). Note that the code itself can be serially extracted from a parallel encoder and unloaded in parallel from a serial encoder, so it can be appended to the egress information in whichever form is more convenient.

Ingress data including any header information is re-encoded, as it is received, as indicated by arrow 512, in encoder 500 using the same code check algorithm that was originally used to encode the data. When an incoming block of data has been received in its entirety, the code generated on that block in encoder 500 is compared to the code received with the data in the comparator 508. If the two codes agree, the data is accepted; if they disagree, an error is flagged.

Since the ingress and egress headers are generally different, the egress information consists of the concatenation of the egress header 516 with the data portion of the ingress information as indicated schematically by arrow 514. The multiplexer 506 is used to concatenate the new header 516 with the ingress data 514 to produce the egress information 518.

The egress encoder 504, in contrast to the ingress encoder 500, does not encode the data directly; rather it generates code checks for the egress information by combining its own intermediate contents with inputs from the ingress encoder 500, via the controller/aligner 502 and from the egress header indicated by arrow 510. The aligner function 502 is needed to compensate for the fact that, in some cases, the ingress data will not be properly aligned with its egress counterpart so the ingress code generated by encoder 500 must be re-aligned accordingly. For expository purposes, it is initially assumed in the following description that the ingress and egress data are properly aligned. The steps required to compensate for misalignment will be addressed subsequently.

Figure 6A:
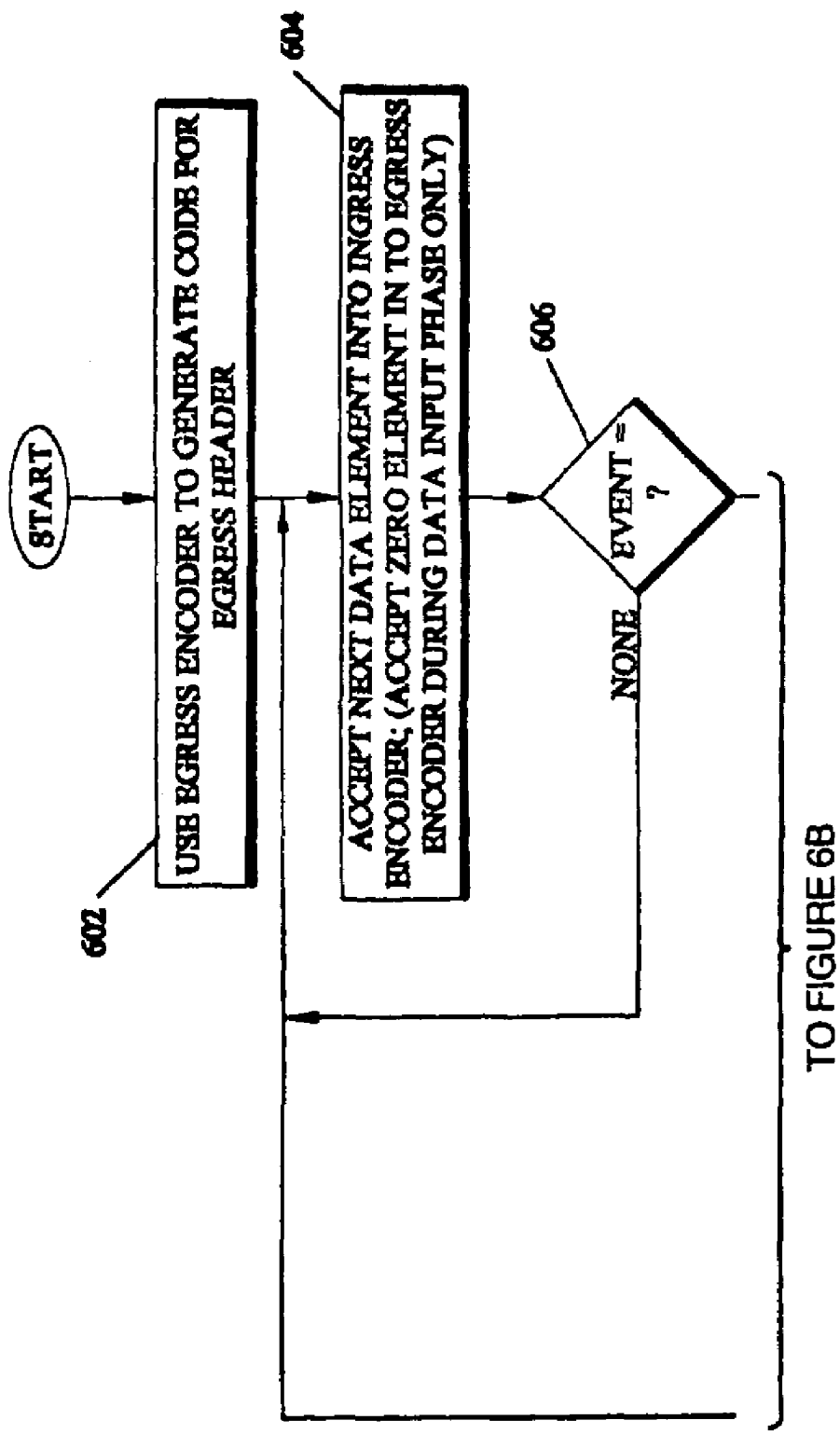
FIGS. 6A and 6B, when placed together, form a flowchart illustrating the steps in a method for operating the apparatus of FIG. 5.
Figure 6B:
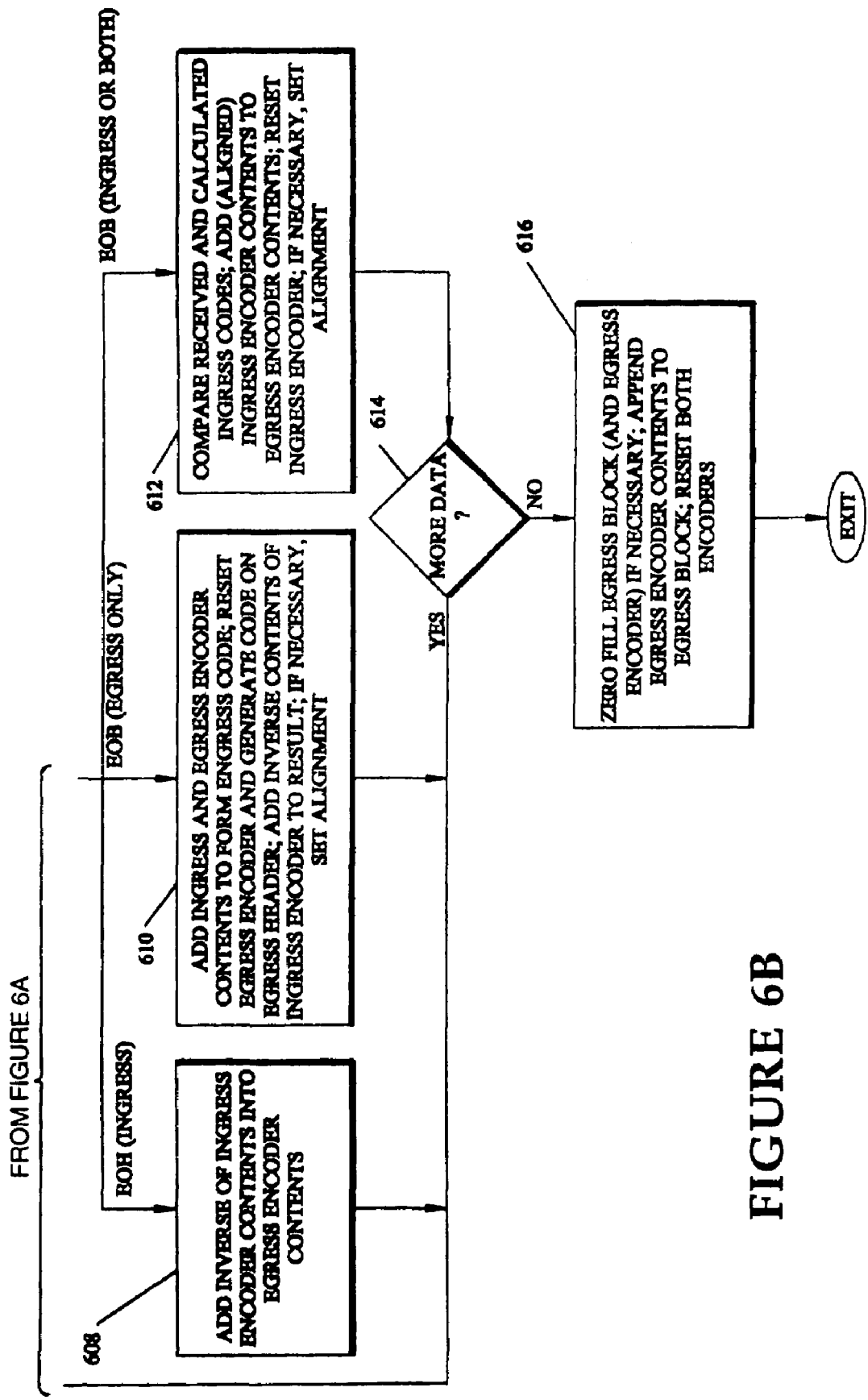

The sequence of operations needed to convert a valid code on the ingress information to a valid code on the egress information without actually re-encoding the data are illustrated in the flowchart shown in FIG. 6. In step 602, the egress encoder 504 is used to generate the code for egress header using the same code check algorithm that is used by the ingress encoder. This can be done in parallel with the use of the ingress encoder 500 to encode the ingress header and data as set forth in step 604. The encoding process in step 604 continues until it is interrupted by any one of three events: the end of an ingress header (EOH), the end of an ingress data block (EOB) possibly coincident with the simultaneous end of an egress data block, or the end of an egress data block not coincident with the end of an ingress data block. The existence of one of these events is checked in step 606. If no event is detected, the process returns to step 604 to continue the encoding process.

If an end-of-ingress-header event occurs the process proceeds to step 605. At this point, the controller/aligner 502 causes the inverse of the contents of the ingress encoder 500 to be added to the contents of the egress encoder 504. This addition cancels out the contribution of the ingress header when, as will be seen shortly, the ingress code generated by the encoder 500 over both the ingress header and the ingress data is added to the contents of the egress encoder 504. The process then returns to step 604.

Next, in step 604, data is sequentially presented to ingress encoder 500 until another event is recognized in step 606 that interrupts this process. If a block-oriented code is being used, one zero binary bit or one all-zeros binary word is presented to the egress encoder 504 during this data phase for each bit or word presented to the ingress encoder 500. This is done because the contribution of a bit or word to the code depends on where it appears in the block. Presenting zeros to the egress encoder 504 while data is being presented to the ingress encoder 500 maintains proper block alignment and ensures the correct contribution of each bit or word to the final code.

Alternatively, if, in step 606, an end-of-ingress-data-block event is detected, the process proceeds instead to step 612. Since a complete ingress header and data block has been received at this point, the received and calculated ingress codes are now compared by comparator 508; if they disagree, an error is flagged and an error recovery routine (not shown) is executed. Otherwise, the contents of the ingress encoder 500 are added to the contents of the egress encoder 504 and the ingress encoder 500 is then reset. Since the effect of the ingress header has already been subtracted out, the net contribution from the ingress encoder 500 is just that of the data portion of the ingress information. In addition, since the contribution to the code of the egress header has also been previously added in, the egress encoder 504 at this point contains a valid code on the egress header concatenated with the ingress data. The process then proceeds to step 614.

If no more ingress data is to be included in the egress data block as determined in step 614, the process proceeds to step 616 where zeros are appended to the data if necessary to complete the egress block and, in the case of block-oriented codes, zeroes used as inputs to the egress encoder 504. The egress encoder 504, at the conclusion of this process, then contains a valid code on the egress header and data and can be used to monitor the integrity of that data as it is transferred and stored elsewhere. The code is therefore appended to the egress block and both the ingress encode 500 and the egress encoder 504 are reset.

However, if the just completed ingress block was not the last block to be included in the egress block, as determined in step 614, the process returns to step 604. The next ingress block is presumably preceded by another header. That header is encoded in step 604 as before and the process continues, first using the ingress encoder 500 to generate the code on the next ingress header, as before, and then continuing to encode the ingress data.

If the end-of-egress-data-block event is detected in step 606 before all the ingress data has been reformatted, the process proceeds to step 610. In step 610, the current contents of the ingress encoder 500 are added to the contents of the egress encoder 504 to form the egress code. Again, since the header contributions to the ingress information have already been subtracted out, the net contribution to the egress code is just that from the portion of the ingress data that has been included in the egress data block. The egress encoder therefore contains a valid code on the egress header and data. Once this code is transferred out, the egress encoder 504 is reset and used to calculate the code on the header of the next egress block and the inverse of the code in the ingress encoder is added to the result. This last step negates the effect that the data included in the current egress block has on the ingress code when it is used to construct the code for the next egress block.

In some cases in which word-oriented codes are used, the data block does not necessarily end at a word boundary. For example, with TCP and UDP, the word length is sixteen bits, but the data portion of the transmission may consist of an odd number of bytes. When this happens, the last byte in the last transmitted word is set to all zeros. When several ingress blocks are packed into a single egress block, these filler bits have to be deleted since they do not represent data.

To compensate for this, the code generated on the next ingress block has to be rotated by an amount equal to the number of non-data bits appended to the previous block. This correctly compensates for the deletion of these non-data bits in the egress block provided the code remains valid under rotation; that is, so long as the code on a set of rotated data words is an equal rotation of the original code on the non-rotated words. It is easily seen that this property is true for both the one's-complement and the vertical-parity-check codes.

To perform this compensation, the aligner 502 in FIG. 5 is set to rotate the next code transferred from the ingress encoder 500 to the egress decoder 504 by the appropriate amount at the end of steps 610 and 612. Alternatively, the aligner 502 could be placed at the input to the ingress encoder 500, thereby shifting the header and data bits before they are encoded rather than the code bits afterwards.

Since it is generally true that both the ingress and egress headers are word aligned (i.e., the header ends and the data starts on a word boundary when word-oriented codes are used), no special alignment procedures are usually needed at the end of steps 602 and 608; that is, the alignment is left unchanged at those points in the procedure. If this is not the case, alignment adjustments can be made at the end of those steps as well.

Since block-oriented codes do not have a word substructure, alignment is generally not an issue when codes of this type are used. If fixed-length blocks are used, however, and bits that have been stuffed into the ingress data stream to complete a block are removed from the egress data stream, an alignment procedure is required for these codes as well. In this case, rather than realigning the ingress code, it is only necessary to inhibit the shifting of zeros into the egress encoder 504 in step 604 for a number of times equal to the number of bits that were stuffed into the ingress data stream. (If a parallel encoder of the type shown in FIG. 4C is used as an egress encoder 504, it has to be modified to support shifts equal to the number of stuffed bits if that number is not an integral multiple of the encoder length. This can be easily done by anyone knowledgeable in CRC encoder design.)

Although hardware encoders are implied in the preceding discussion, they are by no means required. The entire procedure can be readily accomplished in software. The modulo-two addition required for the CRC and the vertical-parity-check codes is easily implemented in a general-purpose processor and the addition needed for the one's-complement code is only slightly more difficult. The rotation required for the alignment of word-oriented codes is also easily done in software. The shift-register operations needed in step 604 to achieve the alignment needed to calculate a valid egress code when CRCs are used, however, are potentially considerably more cumbersome without hardware assistance. Even these operations can be easily accomplished, however, using a general-purpose processor and a relatively small random-access memory.

For example, assume a k-bit data stream represented by $d_k(x)$ is to be concatenated with an m-bit data stream represented by $d_m(x)$ and that the code is defined as the residue of this concatenation modulo $g(x)$. Then, if $r_k(x)$ is the residue of $d_k(x)$, modulo $g(x)$, and $r_m(x)$ is the residue of $d_m(x)$, modulo $g(x)$, the residue of the concatenated data stream, represented by $x^m d_k(x)+d_m(x)$, is $x^m r_k(x)$ mod $g(x)+r_m(x)$. But $x^m r_k(x)$ mod $g(x)$ is equal to the residue modulo $g(x)$ of the quantity $x^m$ mod $g(x)$ multiplied by $r_k(x)$. The operation $x^m r_k(x)$ mod $g(x)$ can therefore be implemented using a random-access memory consisting of m words, each of n bits, with n–1 the degree of the generator polynomial $g(x)$, by storing a word representing the residue $p_i(x)=x^i$ mod $g(x)$ at location i for all i in the range (1,m), multiplying that polynomial by $r_k(x)$ and then using the same memory to determine residues of the at most n–1 terms in the resulting polynomial of degree 2n–2 or less having exponents exceeding n–1. The final step is simply adding, modulo two, the corresponding coefficients of those memory look-ups to each other and to the corresponding coefficients of $r_m(x)$. The whole operation is thus accomplished with at most n memory accesses and modulo-two, n-bit additions and one binary polynomial multiplication. Since m is limited by the maximum block length of interest, the memory needed for this purpose can be relatively small. If the ingress block length is constrained to be, say, an integral number of bytes, then the number of possible values of m is further reduced by a factor of eight and the memory can be correspondingly smaller.

A software implementation of the above-described embodiment may comprise a series of computer instructions either fixed on a tangible medium, such as a computer readable medium, e.g. a diskette, a CD-ROM, a ROM memory, or a fixed disk, or transmissible to a computer system, via a modem or other interface device over a medium. The medium either can be a tangible medium, including, but not limited to, optical or analog communications lines, or may be implemented with wireless techniques, including but not limited to microwave, infrared or other transmission techniques. It may also be the Internet. The series of computer instructions embodies all or part of the functionality previously described herein with respect to the invention. Those skilled in the art will appreciate that such computer instructions can be written in a number of programming languages for use with many computer architectures or operating systems. Further, such instructions may be stored using any memory technology, present or future, including, but not limited to, semiconductor, magnetic, optical or other memory devices, or transmitted using any communications technology, present or future, including but not limited to optical, infrared, microwave, or other transmission technologies. It is contemplated that such a computer program product may be distributed as removable media with accompanying printed or electronic documentation, e.g., shrink wrapped software, pre-loaded with a computer system, e.g., on system ROM or fixed disk, or distributed from a server or electronic bulletin board over a network, e.g., the Internet or World Wide Web.

Although an exemplary embodiment of the invention has been disclosed, it will be apparent to those skilled in the art that various changes and modifications can be made which will achieve some of the advantages of the invention without departing from the spirit and scope of the invention. For example, it will be obvious to those reasonably skilled in the art that, although the description was directed to a particular hardware and/or software system, other hardware and software could be used in the same manner as that described. Other aspects, such as the specific instructions utilized to achieve a particular function, as well as other modifications to the inventive concept are intended to be covered by the appended claims.

What is claimed is:

1. A method for retaining error-control code protection across block-size discontinuities occurring between incoming information, having incoming data formatted into ingress data blocks and ingress headers, one ingress header associated with each ingress data block and conveying information about the each ingress data block, and outgoing information having the incoming data reformatted into egress data blocks with sizes different from the ingress data blocks and egress headers, one egress header associated with each egress data block and conveying information about the each egress data block, the method comprising:
   (a) generating a code check from data in an ingress data block and from an ingress header associated with the ingress data block;
   (b) generating a code check from the code check generated in step (a) and a new egress header associated with an egress data block containing data from the ingress data block but having a different block size; and
   (c) generating the outgoing information by combining the new egress header with the associated egress data block and code check generated in step (b).

2. The method of claim 1 wherein step (b) comprises:
   (b1) generating a code check from the new egress header;
   (b2) generating a code check by subtracting a portion of the code check generated from the associated ingress header in step (a) from the code check generated in step (b1); and
   (b3) adding the code check generated in step (a) to the code check generated in step (b2).

3. The method of claim 2 wherein step (b2) comprises adding the inverse of the portion of the code check generated from the ingress header in step (a) to the code check generated in step (b1).

4. The method of claim 1 wherein step (a) further comprises:
   (a1) rotating the code check generated from data in the ingress data block and the associated ingress header by an amount equal to the number of non-data bits added to a previous ingress data block.

5. The method of claim 1 wherein step (a) further comprises:
   (a2) modifying the incoming information to compensate for non-data bits added to the ingress data block.

6. The method of claim 1 wherein step (c) comprises concatenating the new egress header with the associated egress data block and the code check generated in step (b).

7. The method of claim 1 wherein step (a) comprises generating the code check as a one's-complement sum of successive n-bit binary words included in the ingress data block and the associated ingress header.

8. The method of claim 1 wherein step (b) comprises generating the check code as a one's-complement sum of successive n-bit binary words included in the new egress header.

9. The method of claim 1 wherein step (a) comprises generating the check code as a term-by-term modulo-two sum of successive n-bit binary words included in the ingress data block and the associated ingress header.

10. The method of claim 1 wherein step (b) comprises generating the code check as a term-by-term modulo-two sum of successive n-bit binary words included in the new egress header.

11. The method of claim 1 wherein step (a) comprises generating the code check as the residue of the ingress data block and the associated ingress header modulo a generator polynomial.

12. The method of claim 1 wherein step (b) comprises generating the code check as the residue of the egress data block modulo a generator polynomial.

13. The method of claim 1 wherein the incoming information includes an incoming code check associated with each ingress data block and step (a) further comprises comparing the ingress code check to the incoming code check and generating an error when the ingress code check does not equal the incoming code check.

14. Apparatus for retaining error-control code protection across block-size discontinuities occurring between incoming information, having incoming data formatted into ingress data blocks and ingress headers, one ingress header associated with each ingress data block and conveying information about the each ingress data block, and outgoing information having the incoming data reformatted into egress data blocks with sizes different from the ingress data blocks and egress headers, one egress header associated with each egress data block and conveying information about the each egress data block, the apparatus comprising:
   an ingress encoder that generates an ingress code check from data in an ingress data block and from an ingress header associated with the ingress data block;
   an egress encoder that generates a egress code check from (1) a new egress header associated with an egress data block containing data from the ingress data block but having a different block size and (2) the ingress code check; and
   a multiplexer that generates the outgoing information by combining the new egress header with the associated egress data block and the egress code check.

15. The apparatus of claim 14 wherein the egress encoder comprises:
   an outgoing encoder that generates an egress code check from the new egress header and from intermediate contents of the outgoing encoder;
   a controller that subtracts a portion of the ingress code check generated from the associated ingress header from the outgoing encoder intermediate contents and adds the ingress code check to the outgoing encoder intermediate contents.

16. The apparatus of claim 15 wherein the controller further comprises a mechanism that modifies the ingress code check to compensate for non-data bits added to the ingress data block.

17. The apparatus of claim 15 wherein the controller comprises a mechanism that rotates the bits of the ingress code check to compensate for non-data bits added to the ingress data block.

18. The apparatus of claim 15 wherein the controller adds the inverse of the portion of the code check generated from the ingress header by the ingress encoder to the outgoing encoder contents.

19. The apparatus of claim 14 further comprising a mechanism that modifies the incoming information to compensate for non-data bits added to the ingress data block.

20. The apparatus of claim 14 wherein the multiplexer comprises a mechanism that concatenates the new egress header with then associated egress data block and the egress code check.

21. The apparatus of claim 14 wherein the ingress encoder comprises a one's-complement encoder that generates a one's-complement sum of successive n-bit binary words included in the ingress data block and the associated ingress header.

22. The apparatus of claim 14 wherein the outgoing encoder comprises a one's-complement encoder that generates a one's-complement sum of successive n-bit binary words included in the new egress header.

23. The apparatus of claim 14 wherein the ingress encoder comprises a vertical-parity-check encoder that generates a term-by-term modulo-two sum of successive n-bit binary words included in the ingress data block and the associated ingress header.

24. The apparatus of claim 14 wherein the outgoing encoder comprises a vertical-parity-check encoder that generates a term-by-term modulo-two sum of successive n-bit binary words included in the new egress header.

25. The apparatus of claim 14 wherein the ingress encoder comprises a cyclic-residue-code encoder that generates the residue of the ingress data block and the associated ingress header modulo a generator polynomial.

26. The apparatus of claim 14 wherein the outgoing encoder comprises a vertical-parity-check encoder that generates the residue of the egress data block modulo a generator polynomial.

27. The apparatus of claim 14 wherein the incoming information includes an incoming code check associated with each ingress data block and the apparatus further comprises a comparator for comparing the ingress code check to the incoming code check and generating an error when the ingress code check does not equal the incoming code check.

28. A computer program product for retaining error-control code protection across block-size discontinuities occurring between incoming information, having incoming data formatted into ingress data blocks and ingress headers, one ingress header associated with each ingress data block and conveying information about the each ingress data block, and outgoing information having the incoming data reformatted into egress data blocks with sizes different from the ingress data blocks and egress headers, one egress header associated with each egress data block and conveying information about the each egress data block, the computer program product comprising a computer usable medium having computer readable program code thereon, including:
  program code that generates an ingress code check from data in an ingress data block and from an ingress header associated with the ingress data block;
  program code that generates a egress code check from (1) the ingress code check and (2) a new egress header associated with an egress data block containing data from the ingress data block but having a different block size; and
  program code that generates the outgoing information by combining the new egress header with the associated egress data block and the egress code check.

29. The computer program product of claim 28 wherein the program code that generates an egress code check comprises:
  program code that generates an egress code check from the new egress header;
  program code that subtracts a portion of the ingress code check generated from the associated ingress header from the egress code check; and
  program code that adds the ingress code check to the egress code check.

30. The computer program product of claim 29 wherein the program code that subtracts a portion of the ingress code check from the egress code check comprises program code that adds the inverse of the portion of the ingress code check to the egress code check generated.

31. The computer program product of claim 28 wherein the program code that generates an ingress code check further comprises program code that rotates the ingress code check by an amount equal to the number of non-data bits added to a previous ingress data block.

32. The computer program product of claim 28 wherein the program code that computes the ingress code check further comprises program code that modifies the incoming information to compensate for non-data bits added to the ingress data block.

33. The computer program product of claim 28 wherein the program code that generates the outgoing information comprises program code that concatenates the new egress header with the associated egress data block and the egress code check.

34. The computer program product of claim 28 wherein the program code that generates the ingress code check comprises program code that generates a one's-complement sum of successive n-bit binary words included in the ingress data block and the associated ingress header.

35. The computer program product of claim 28 wherein the program code that generates the egress code check comprises program code that generates a one's-complement sum of successive n-bit binary words included in the new egress header.

36. The computer program product of claim 28 wherein the program code that generates the ingress code check comprises program code that generates a term-by-term modulo-two sum of successive n-bit binary words included in the ingress data block and the associated ingress header.

37. The computer program product of claim 28 wherein the program code that generates the egress code check comprises program code that generates a term-by-term modulo-two sum of successive n-bit binary words included in the new egress header.

38. The computer program product of claim 28 wherein the program code that generates the ingress code check comprises program code that generates the residue of the ingress data block and the associated ingress header modulo a generator polynomial.

39. The computer program product of claim 28 wherein the program code that generates the egress code check comprises program code that generates the residue of the egress data block modulo a generator polynomial.

40. The computer program product of claim 28 wherein the incoming information includes an incoming code check associated with each ingress data block and wherein the program code that generates the ingress code check further comprises program code that compares the ingress code check to the incoming code check and generates an error when the ingress code check does not equal the incoming code check.

41. A computer data signal embodied in a carrier wave for retaining error-control code protection across block-size discontinuities occurring between incoming information, having incoming data formatted into ingress data blocks and ingress headers, one ingress header associated with each ingress data block and conveying information about the each ingress data block, and outgoing information having the incoming data reformatted into egress data blocks with sizes different from the ingress data blocks and egress headers, one egress header associated with each egress data block and conveying information about the each egress data block, the computer data signal comprising:
  program code that generates an ingress code check from data in an ingress data block and from an ingress header associated with the ingress data block;
  program code that generates a egress code check from (1) the ingress code check and (2) a new egress header associated with an egress data block containing data from the ingress data block but having a different block size; and
  program code that generates the outgoing information by combining the new egress header with the associated egress data block and the egress code check.

* * * * *